US007145928B1

(12) United States Patent
Maxim et al.

(10) Patent No.: US 7,145,928 B1
(45) Date of Patent: Dec. 5, 2006

(54) SYSTEMS AND METHODS FOR USING CASCODED OUTPUT SWITCH IN LOW VOLTAGE HIGH SPEED LASER DIODE AND EAM DRIVERS

(75) Inventors: Adrian Maxim, Austin, TX (US); Jaideep Prakash, Austin, TX (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 60 days.

(21) Appl. No.: 10/642,774

(22) Filed: Aug. 18, 2003

(51) Int. Cl.
*H01S 3/00* (2006.01)

(52) U.S. Cl. .............................. 372/38.02; 372/38.07; 372/38.01

(58) Field of Classification Search ............. 372/38.02, 372/38.07, 38.01, 29.4, 38.1, 29.015
See application file for complete search history.

(56) References Cited

U.S. PATENT DOCUMENTS

| | | | |
|---|---|---|---|
| 5,043,992 A * | 8/1991 | Royer et al. .................. 372/34 |
| 5,850,409 A | 12/1998 | Link | |
| 5,883,910 A | 3/1999 | Link | |
| 6,859,473 B1 * | 2/2005 | Tan .......................... 372/38.02 |
| 6,879,608 B1 * | 4/2005 | Schuelke et al. ......... 372/38.02 |
| 2003/0091077 A1 * | 5/2003 | Fischer .................... 372/38.02 |

\* cited by examiner

*Primary Examiner*—Minsun Oh Harvey
*Assistant Examiner*—Tod T. Van Roy
(74) *Attorney, Agent, or Firm*—Blakely, Sokoloff, Taylor & Zafman LLP

(57) ABSTRACT

High frequency laser diode (LD) and electro-absorption modulator (EAM) integrated circuit drivers using a cascaded output switch architecture that increases the output current and voltage edge speed and reduces the peaking and ringing of the output waveform, thus improving the deterministic jitter performance. Also disclosed is a method and apparatus that provides a modulation current dependence of both turn-on and turn-off driving currents that lead to an optimal compromise between the edge speed and output overshoot for a wide range of modulation currents. A PTAT temperature dependence of both voltage swing and current level in the predriver assures a low variation of the overshoot and rise/fall time over a wide temperature range. Using the cascaded output switch architecture provides an easy way of on-chip summation of the modulation and bias currents. Biasing the cascode device with a supply and modulation current dependent base voltage provides an optimum headroom output switch.

24 Claims, 9 Drawing Sheets

First embodiment of the
cascoded output switch LD/EAM
driver architecture

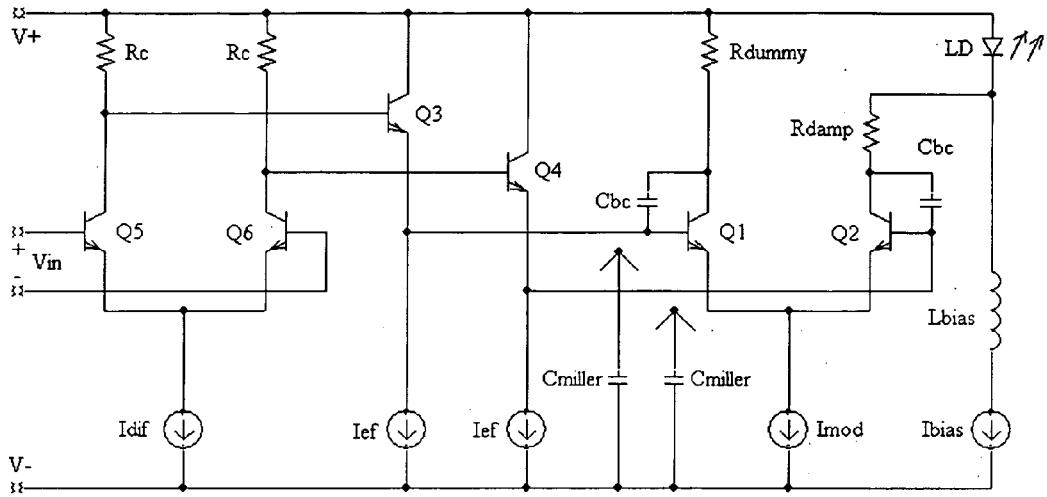
Fig.1 Prior art DC coupled laser diode driver
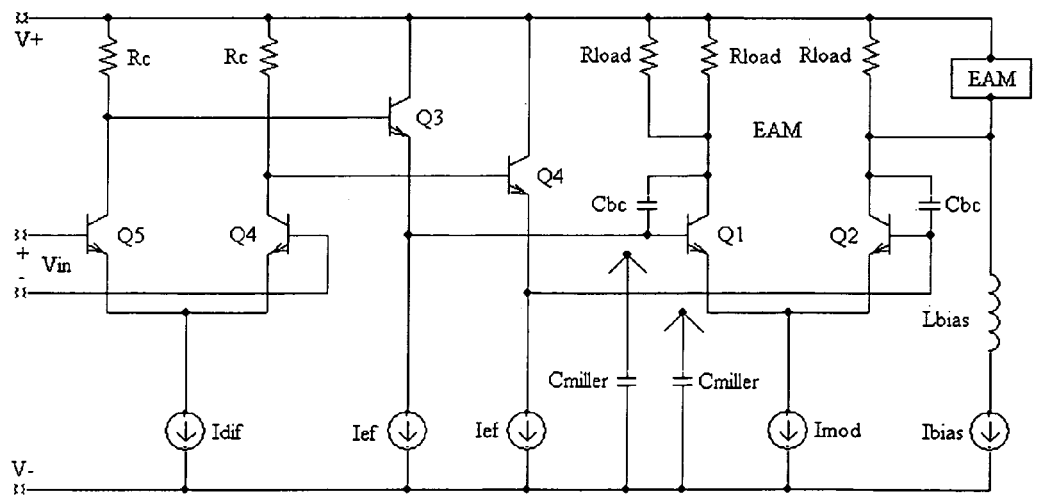
Fig.2 Prior art DC coupled EAM driver

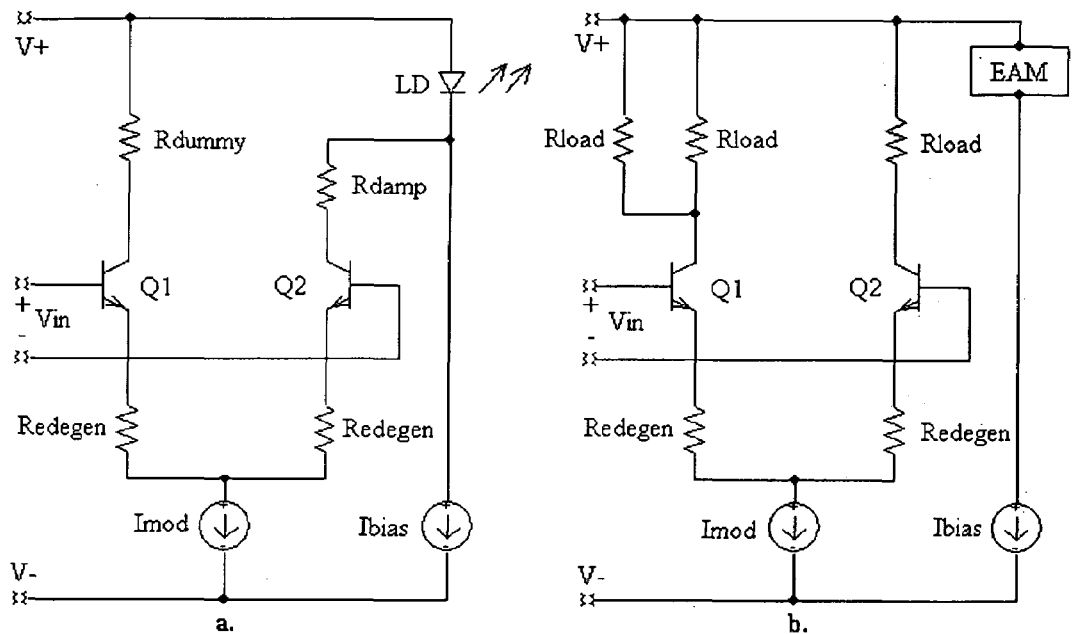
Fig. 3 Prior art output switch with emitter degeneration: a. LD driver, b. EAM driver
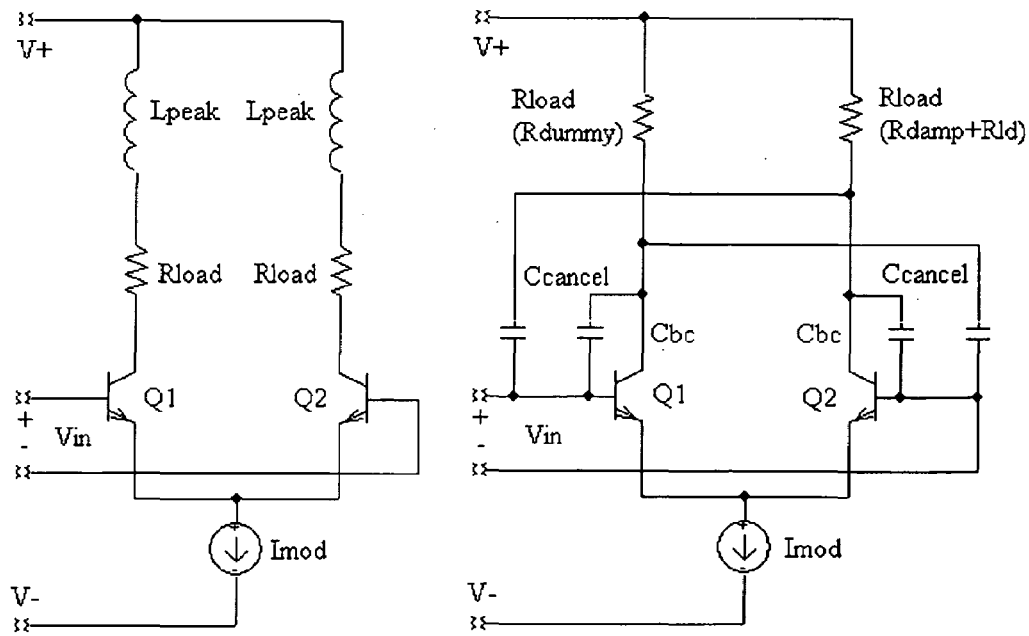
Fig. 4 Prior art output switch with inductive peaking
Fig. 5 Prior art output switch with Miller compensation

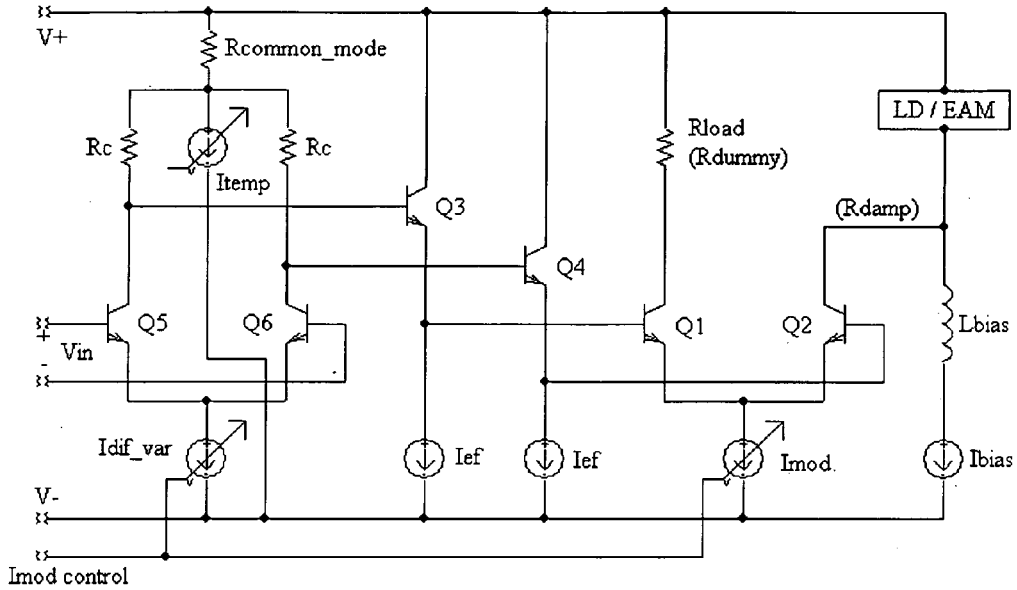
Fig. 6 Prior art LD/EAM driver with temperature compensation of the output switch headroom
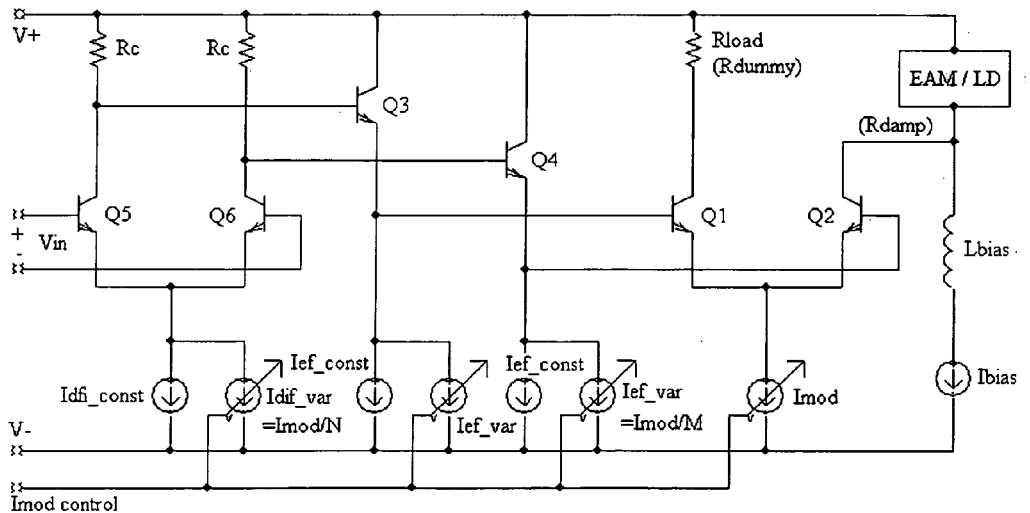
Fig. 7 Prior art LD/EAM driver with modulation current dependence of the predriver current level and voltage swing

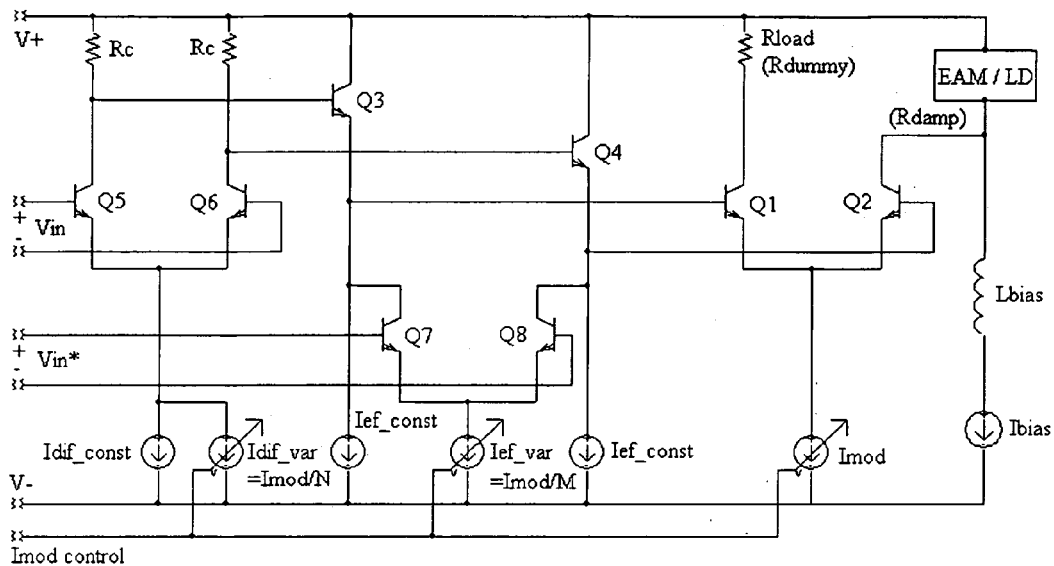
Fig. 8 Prior art LD/EAM driver with dynamic emitter follower to assure different turn-on and turn-off driving currents
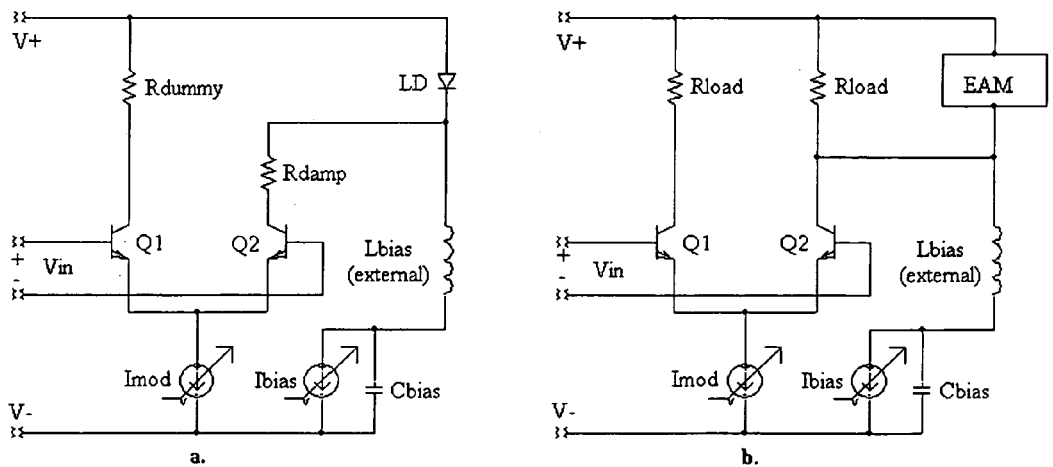
Fig. 9 Prior art LD/EAM driver with off-chip summation of the modulation and bias currents using a high value inductance

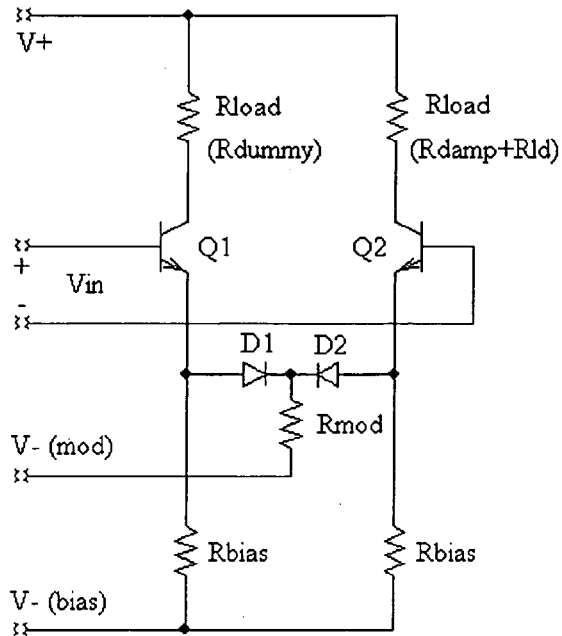
Fig. 10 Prior art LD/EAM driver that eliminates the separate bias current by using a differential pair that switches between two on-state current levels
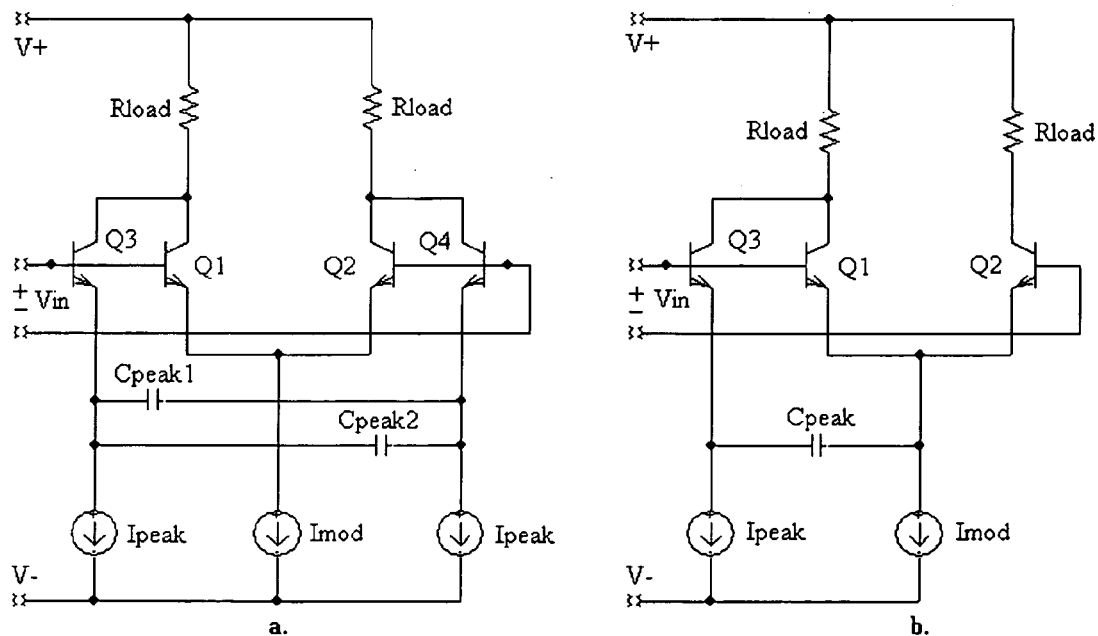
Fig. 11 Prior art dynamic emitter follower used to reduce the output overshoot:
a. balanced dynamic emitter follower, b. one-sided dynamic emitter follower

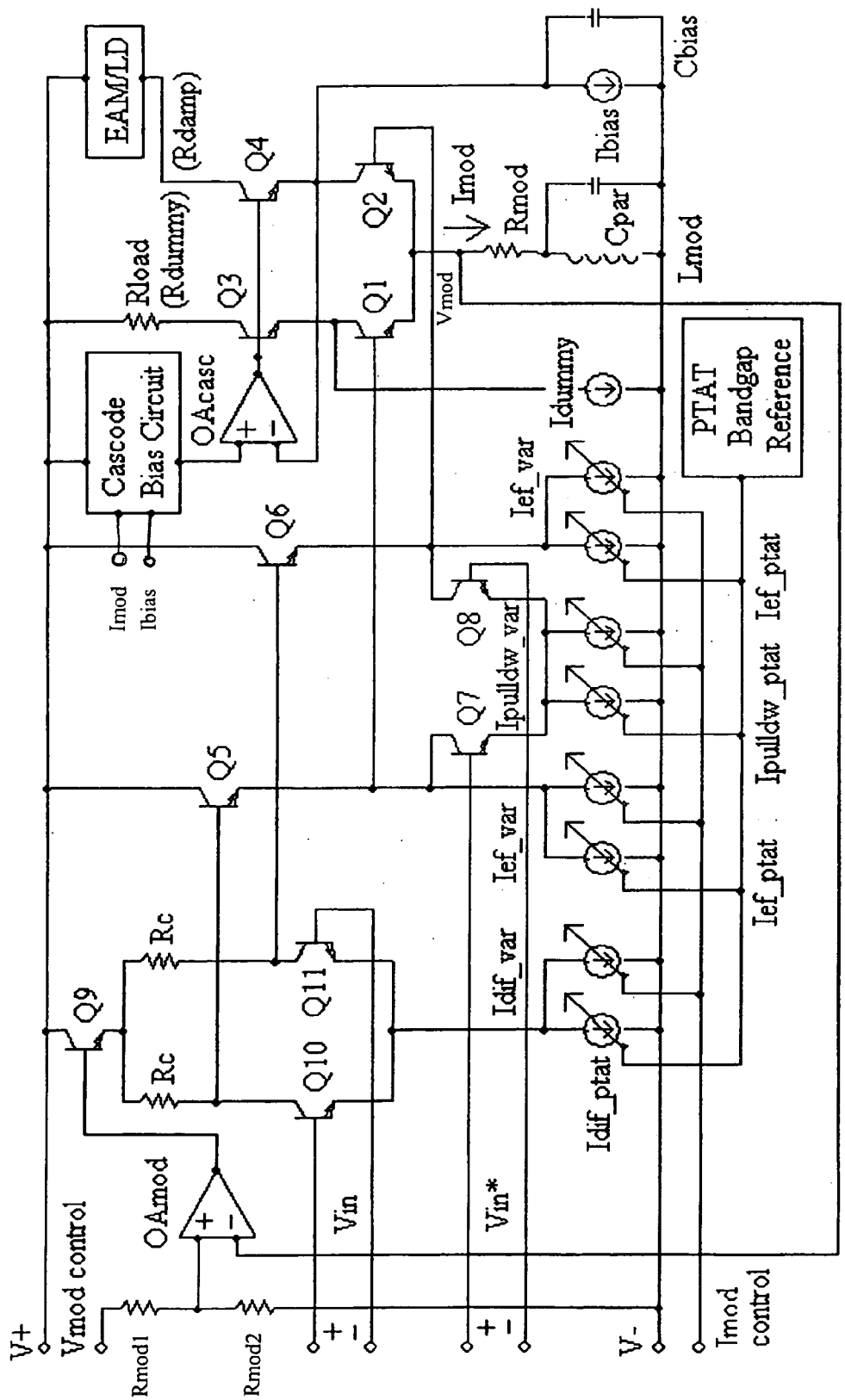
Fig.12 Cascode output switch LD/EAM driver architecture

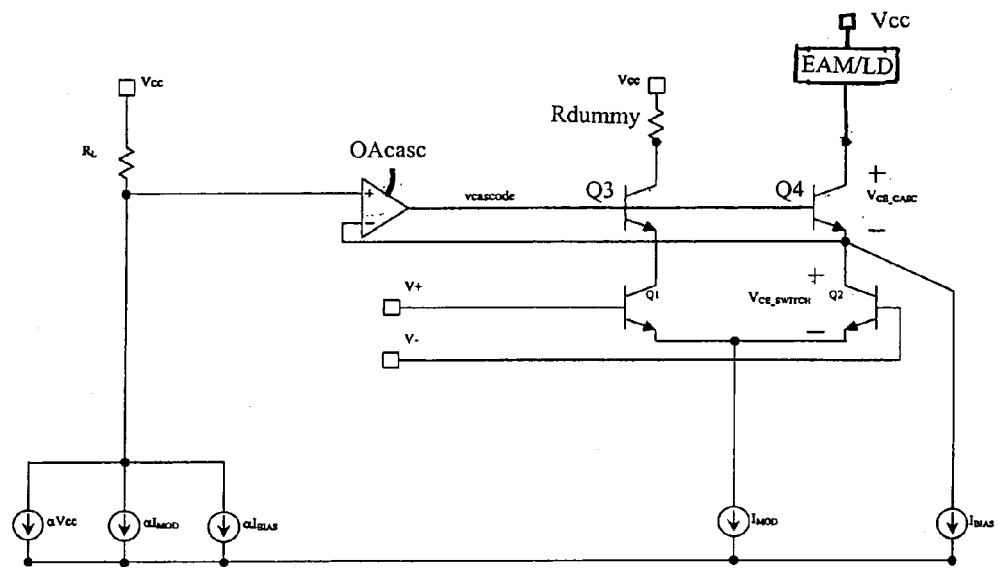
Figure 12a Cascode Bias Circuit
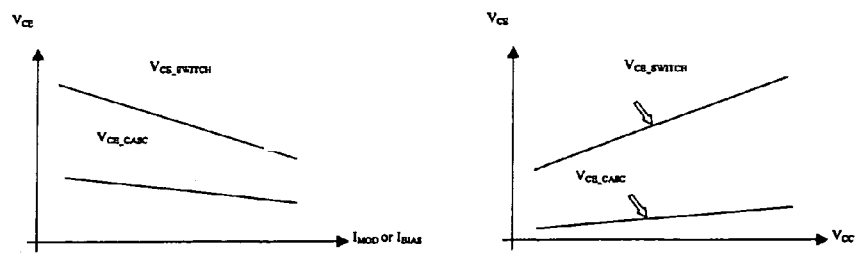
Figure 12b Cascode Bias Circuit Response

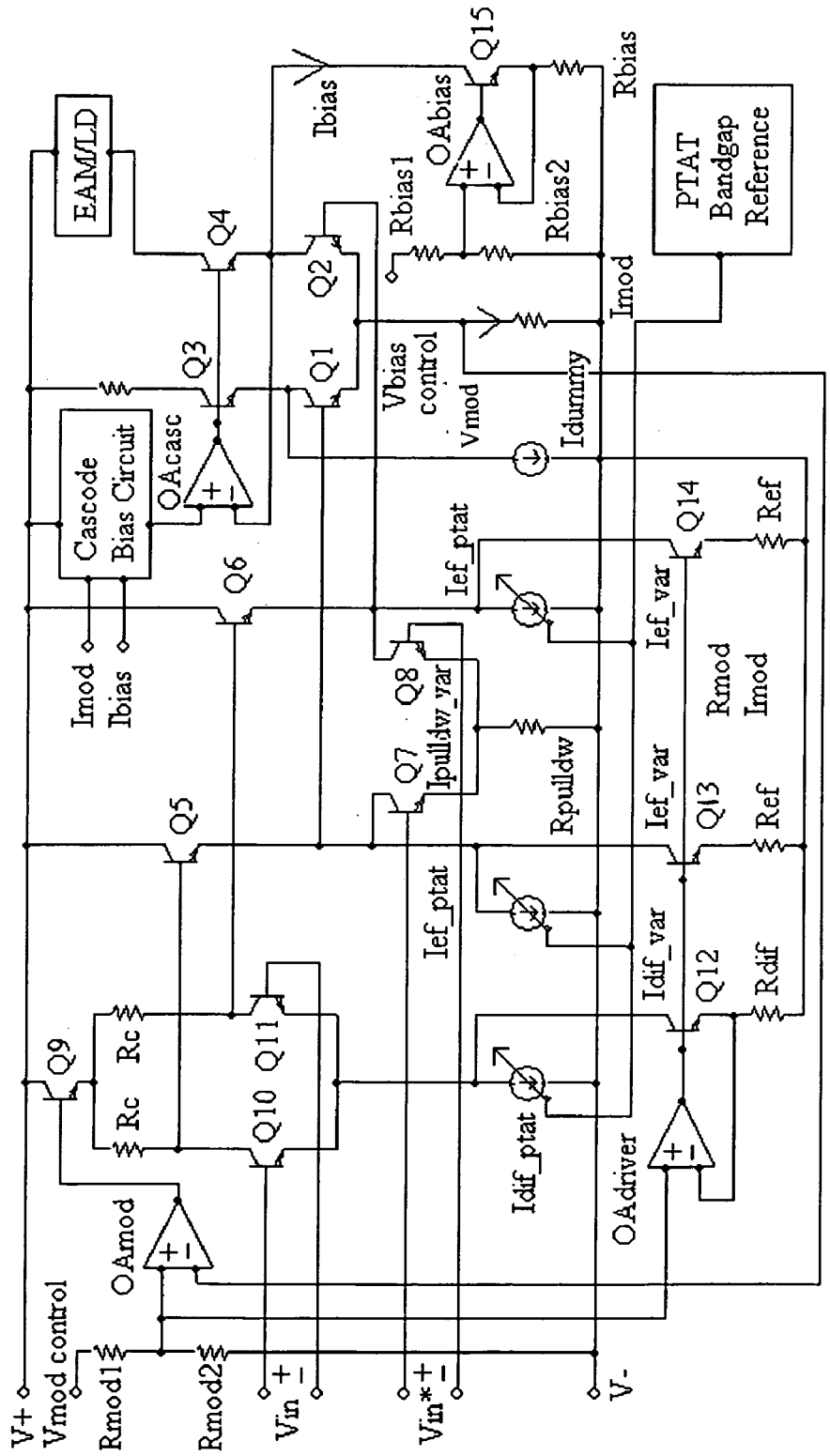
Fig. 13 First embodiment of the cascoded output switch LD/EAM driver architecture

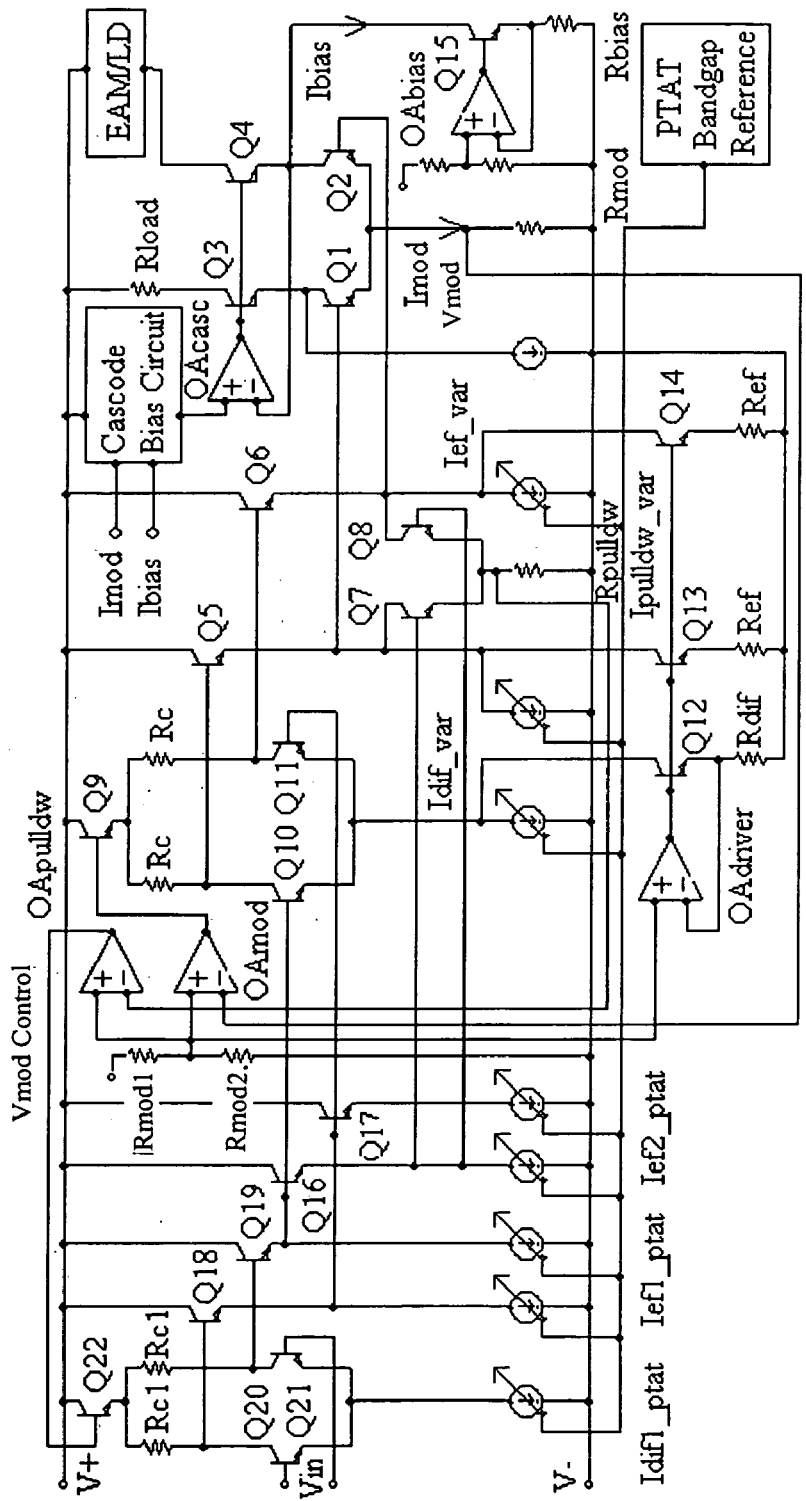
Fig. 14 Second embodiment of the cascoded output switch LD/EAM driver architecture

SYSTEMS AND METHODS FOR USING CASCODED OUTPUT SWITCH IN LOW VOLTAGE HIGH SPEED LASER DIODE AND EAM DRIVERS

BACKGROUND OF THE INVENTION

1. Field of the Invention

The present invention relates to the field of high speed, wide output current/voltage range laser diode/EAM driver circuits.

2. Prior Art

A laser diode (LD) is an opto-electronic device that provides an output light beam when the current through it goes over the lasing threshold current.

An electro-absorption-modulator (EAM) is an opto-electronic device that modulates the intensity of an incoming light beam based on the level of an electrical control voltage.

A bias current is a constant current that places an opto-electronic device just over the lasing threshold.

A modulation current is a switching current that brings the opto-electronic device further into the lasing mode.

A laser diode/EAM driver is a circuit that provides the control currents and voltages to an opto-electronic lasing device. It consists of a cascade of current switching stages and buffers that provide the appropriate amount of voltage and current gain, assuring optimal switching of the lasing device.

Edge Speed Improvement

The use of laser diodes with high extinction ratios requires laser drivers that are able to switch large currents. This results in the usage of large output transistors that have high feedback (Cbc—base-collector or Cgd—gate-drain) capacitances. These feedback capacitances (Cbc in FIG. 1 and FIG. 2) appear multiplied by the gain of the output switch (through the Miller effect—$C_{Miller}$) at the input of the differential output switch, heavily loading the predriver and therefore significantly reducing the edge speed. The high current in the output switch results in a high voltage gain, resulting in a more pronounced Miller effect, and also a higher base-emitter charge storage capacitance (Cbe=Cpi) that adds to the capacitive loading of the predriver and further slows the output current/voltage waveform. There is a significant speed penalty for EAM drivers (that operate in a 50 Ohm environment) and laser drivers working in high impedance environments ($Z_0$>25–30 Ohms).

Several methods have been used in the prior art to improve the edge speed. A first solution is to introduce emitter degeneration resistors (Rdegen) as presented in FIGS. 3a and 3b for LD and EAM drivers, respectively. The emitter degeneration decreases the voltage gain of the output switch and thus reduces the capacitive loading on the predriver due to the Miller effect. The emitter degeneration also reduces the loading on the predriver due to the lower effective base-emitter (Cpi) capacitance. Reducing both capacitive loadings on the predriver results in a significant speed-up of the driving voltage at the input of the output switch, and therefore a faster output waveform is obtained.

The foregoing method works well at high supply voltages or at low modulation currents where the voltage drop across the degeneration resistor does not significantly impact the headroom available to the switch. The major drawback of the emitter degeneration technique is that it requires a high voltage drop across the degeneration resistance. Specifically, to obtain a low voltage gain, the degeneration resistance needs to be a good fraction of the load resistance, making the circuit inoperable at high modulation currents and low supply voltages. In addition, the layout is not as compact, leading to more metal connections between transistors and degeneration resistors that add significant parasitic capacitances. These extra emitter capacitances enhance the peaking of the output waveform, requiring more RC compensation to be used. This slows down the edges, and thus part of the speed-up advantage given by the emitter degeneration is lost.

A second method used in the prior art to speed-up the driver is to add inductive peaking in the collector (drain) of the output switch as presented in FIG. 4. However, on-chip inductances capable of passing high current levels have high parasitic capacitances that short them at high frequencies. This is why in most cases the inductive peaking is done using bond-wire inductances (Lpeak). The major drawback of the inductive peaking is that it trades additional edge speed for more overshoot of the output waveform that gives supplementary deterministic jitter.

The inductive peaking works fairly well for the EAM drivers that use a symmetric differential output switch and have higher output impedances. In the case of laser drivers that in most cases require an open collector output switch and usually operate in much lower impedance environments (10–20 Ohm versus 50 Ohm for EAM drivers), adding series inductance to speed up the edges gives excessive overshoot that needs to be damped with additional RC compensation, which in turn slows down the edges. Also if the series inductance becomes high so that the L/R time constant becomes comparable with the data rate, the series inductance can even lead to a slowdown of the edge speed.

In the case of EAM drivers, the inductive peaking is performed by inductances not in the path to the EAM device, and therefore can be well controlled. In the case of laser drivers, the inductive peaking is difficult to control, as the inductive peaking element is in the path from the laser driver to the laser diode. This path is layout specific and varies from one assembly to another.

A third method used in the prior art to speed-up the driver is the neutralization of the Miller effect. This was done by adding two Miller effect cancellation capacitances (Ccancel) to the differential pair, each from the base of a respective device to the collector of the opposite device (in FIG. 5 from the base of Q1 to the collector of Q2 and from the base of Q2 to the collector of Q1). If these two capacitors closely match the base-collector capacitance (Cbc) of the output switch transistors (Q1 and Q2) they can provide a precise cancellation of the Miller effect. In real circuits, there will always be a mismatch that will reduce the Miller cancellation effect. Good matching can be achieved by using transistors of the same size as the output switch transistors for the Miller cancellation capacitances. The major drawback of this Miller cancellation technique is that the cancellation devices significantly increase the output capacitance of the driver and thus reduces the frequency of the ringing that appears during the switching process. If the ringing frequency comes close to the data-rate, it cannot be filtered-out by the SONET filter and will seriously increase the deterministic jitter. This Miller cancellation technique works well when the predominant slowing down effect is the capacitive loading of the predriver and not the output capacitance of the driver.

Temperature Compensation

The prior art has used various temperature compensation techniques to improve the laser diode switching behavior over temperature. One technique uses a laser driver that gives a modulation current that includes a positive temperature coefficient (PTAT) to compensate for the effects of the laser diode temperature increase.

Another technique uses a temperature dependent current (Itemp) to regulate the common-mode voltage at the bases of the switches Q1 and Q2 as shown in FIG. 6. By compensating for the temperature dependence of the VBE voltage of the output switch, the collector-emitter voltage (headroom) of the switch is maximized for a given power supply, assuring a higher edge speed.

Overshoot and Rise/Fall Time Control with Modulation Current Dependence of the Predriver Circuits Actual laser drivers are required to operate over a wide modulation current range. Optimizing the rise/fall time and the overshoot/undershoot of the output waveform (current for a LD and voltage for an EAM) requires a modulation current dependence of the pre-driver currents.

Most of the prior art uses standard emitter followers in the pre-driver (Q3 and Q4 in FIG. 7). The drawback of this architecture is that it gives the same value of current for both turn-on and turn-off, leading to significant overshoot at turn-on when a high edge speed at turn-off is required.

An improvement of the standard emitter follower pre-driver architecture is presented in FIG. 8. It consists of using a dynamic emitter follower (devices Q3, Q4 and Q7, Q8) that has a different tail current at turn-on (Ief) and turn-off (Ief+Imod/M). This will bring a compromise between the rise/fall time and the overshoot. The drawback of this architecture is that it uses a constant turn-on current for all the modulation current levels, leading to excessive overshoot at low modulation currents. Another drawback is that the dynamic emitter followers require an additional driving voltage Vin* in phase opposition with the main input voltage Vin. The delay time from the Vin* input to the differential pair Q7, Q8 needs to be smaller than the delay time from the main input Vin to the Q3, Q4 emitter followers in order that the pull-up and pull-down current levels are set-up correctly. Achieving this delay time constraint requires a high current consumption in the additional driving path.

Another method to reduce the output rise/fall time is to use either symmetric or asymmetric dynamic coupled emitter followers (Q3, Q4 and Q7, Q8) that injects capacitive charging currents in the output switch, enhancing the peaking and therefore speeding-up the edges, as shown in FIG. 11. The advantage of this method over the traditional inductive peaking is that the edge speed is improved without worsening the ringing of the output current/voltage (without affecting the damping of the output RLC circuit). The drawback of this architecture is the increased supply current and large area of on-chip capacitance required for the dynamic coupling of the emitter follower. Furthermore, the overshoot cancellation is fixed and does not track with the external element layout.

On-Chip Versus Off-Chip Summation of Bias and Modulation Currents

The independent control of the bias and modulation current is achieved in most of the prior art by using two separate current sources. The summation of the bias current (Ibias) to the modulation current (Imod) is usually done off-chip by using a high value inductance (Lbias) to minimize the capacitive loading of the driver output by the bias circuitry (Cbias) as shown in FIG. 9.

The direct summation of the bias and modulation current at the driver output brings a severe edge speed penalty due to the capacitive loading of the driver output. One solution to this problem, as presented in FIG. 10, is to eliminate the separate bias circuit and to use a differential output pair (Q1, Q2) in which the devices switch between two on-state current levels. This eliminates any additional capacitive loading from the bias circuit. This architecture significantly improves the edge speed due to the switching between two on-state current levels, which is much faster than the on-off switching.

Predriver Current Control

Most prior art laser/EAM drivers use off chip control voltages to adjust both the voltage swing (Imod/N) and the pre-driver current levels (Imod/M) (see FIG. 7). These external adjustments are meant to optimize the switching performance when operating over wide modulation current and temperature ranges.

BRIEF DESCRIPTION OF THE DRAWINGS

FIG. 1 is a circuit diagram for a prior art DC coupled laser diode driver.

FIG. 2 is a circuit diagram for a prior art DC coupled EAM driver.

FIGS. 3a and 3b are circuit diagrams for a prior art output switch with emitter degeneration for use as an LD driver, and for use as an EAM driver, respectively.

FIG. 4 is a circuit diagram for a prior art output switch with inductive peaking.

FIG. 5 is a circuit diagram for a prior art output switch with Miller compensation.

FIG. 6 is a circuit diagram for a prior art LD/EAM driver with temperature compensation of the output switch headroom.

FIG. 7 is a circuit diagram for a prior art LD/EAM driver with modulation current dependence of the predriver current level and voltage swing.

FIG. 8 is a circuit diagram for a prior art LD/EAM driver with dynamic emitter follower to assure different turn-on and turn-off driving currents.

FIG. 9 is a circuit diagram for a prior art LD/EAM driver with off-chip summation of the modulation and bias currents using a high value inductance.

FIG. 10 is a circuit diagram for a prior art LD/EAM driver that eliminates the separate bias current by using a differential pair that switches between two on-state current levels.

FIGS. 11a and 11b are circuit diagrams for prior art dynamic emitter followers used to reduce the output overshoot comprising a balanced dynamic emitter follower, and a one-sided dynamic emitter follower, respectively.

FIG. 12 is a circuit diagram for a cascode output switch LD/EAM driver in accordance with the present invention.

FIG. 12a is a circuit diagram for an exemplary cascode bias circuit that may be used in the circuit of FIG. 12.

FIG. 12b are curves illustrating the Imod, Ibias and VCC dependence of the collector emitter voltage of the output switches using the cascode bias circuit of FIG. 12a in the circuit of FIG. 12.

FIG. 13 is a circuit diagram for an exemplary embodiment of the cascaded output switch LD/EAM driver architecture of the present invention.

FIG. 14 is a circuit diagram for another exemplary embodiment of the cascaded output switch LD/EAM driver architecture of the present invention.

DETAILED DESCRIPTION OF THE PREFERRED EMBODIMENTS

FIG. 12 presents the principal architecture of the cascoded output switch laser diode/EAM driver of the present invention. This driver assures both fast switching and a relatively low supply voltage VCC operation, dependent on the required output voltage swing Vswing. As a minimum supply voltage, VCC≈Vswing+1.5V.

The circuit of FIG. 12 has power supply connections V+ (VCC) and V− (circuit ground), control inputs Vmod control and Imod control and a pair of complimentary differential input signals Vin and Vin*. Devices Q10 and Q11 are coupled as a differential pair having a tail current with a proportional to absolute temperature (ptat) component Idif_ptat from a PTAT Bandgap Reference, and a substantially constant component Idif_var as set through the Imod control terminal. Resistors Rc act as load resistors for devices Q10 and Q11, with the differential voltages across resistors Rc driving the bases of emitter followers Q5 and Q6. Devices Q5 and Q6 have a bias current also having a proportional to absolute temperature component Ief_ptat and a substantially constant component set externally through the Imod control. Devices Q5 and Q6 may further have an additional bias current, itself having a proportional to absolute temperature component Ipulldw_ptat and a substantially constant component Ipulldw_var, also set externally through the Imod control, depending on whether device Q7 directing the additional current through device Q5, or device Q8 directing the additional current through device Q6, is on. By proper phasing of the input signal Vin* with respect to the basic input signal Vin, the turn-off current for devices Q5 and Q6 may be made larger than the turn-on current for these devices. This provides control of the overshoot and rise/fall times with temperature through the PTAT dependence, and control of the modulation current by the external setting of the Imod control.

The output of emitter followers Q5 and Q6 is coupled to the bases of the output switches Q1 and Q2, coupled as a differential pair with a tail current Imod flowing through resistor Rmod and inductance Lmod, capacitance Cpar being the associated parasitic capacitance. The voltage across the resistor Rmod is fed back through the negative input of operational amplifier OAmod. The positive input of operational amplifier OAmod is externally provided through the Vmod control, as divided down by resistors Rmod1 and Rmod2. The output of the amplifier OAmod is coupled to the base of transistor Q9, which controls the voltage at the common connection of the load resistors Rc. When the differential input Vin is positive, device Q10 will be on and device Q11 will be off. Thus the base of device Q6 will be at a higher voltage than the base of device Q5, causing the base of switch Q2 to be higher than the base of switch Q1, turning switch Q2 on and switch Q1 off. Under these conditions, the voltage fed back to the negative input of the operational amplifier OAmod will be equal to the voltage drop across resistor Rmod which, neglecting emitter currents, will be equal to the voltage at the emitter of device Q9 minus the VBEs of devices Q6 and Q2. (The current in the load resistor Rc associated with device Q11 being zero at this time because of device Q11 being off.) Similarly, in the other half cycle, the voltage across resistor Rmod is equal to the voltage on the emitter of device Q9 minus the VBEs of devices Q5 and Q1. Thus the Vmod control sets the voltage across resistor Rmod, and thus the modulation current or tail current Imod for output switches Q1 and Q2, whereas the Imod control sets a component of the tail current for devices Q10 and Q11, a component of the bias current for devices Q5 and Q6 and a component of the tail current for differential pair Q7 and Q8.

Devices Q3 and Q4 are coupled as cascode devices for the output switches Q1 and Q2, respectively. The base voltages for the cascode devices Q3 and Q4 are set by the output of the operational amplifier OAcasc. In particular, the operational amplifier OAcasc drives the bases of cascode devices Q3 and Q4 so that the emitter voltage for device Q4 is equal to the output of the Cascode Bias Circuit. Thus the output of the amplifier OAcasc will generally be one VBE above the input voltages thereto. Since the emitter voltages of output switches Q1 and Q2 are set through the Vmod control, the cascode bias circuit effectively sets the collector to emitter voltages on the output switches Q1 and Q2. Also as may be seen in FIG. 12, a bias current Ibias is coupled to the emitter of cascode device Q4 to provide the desired bias current to the EAM/LD.

The cascode bias, together with associated parts of the circuit of FIG. 12, is shown in FIG. 12a. The bias node for the cascode devices, vcascode, is dynamically adjusted as a function of the modulation current $I_{mod}$ and bias current $I_{bias}$, and the power supply voltage Vcc. This allows the output voltage to be split across the cascode devices (Q3 and Q4) and switching transistors (Q1 and Q2) for optimal switching of the output. Also, by dynamically allocating the output voltage across the cascode and switching transistors as a function of modulation/bias currents, and power supply voltage, breakdown hazards are avoided at the output under conditions of low modulation/bias currents, and high supply voltages. The cascode bias voltage, vascode, is generated by the feedback loop consisting of the output of the cascode bias circuit and amplifier OAcasc which is compared to a voltage which includes the base-emitter drop of cascode devices Q3 and Q4. By including the base-emitter drop of the cascode devices in the feedback loop, temperature and process variations are dynamically adjusted by the feedback loop, maintaining the desired collector-emitter voltage across the cascode and switching devices.

The cascode bias circuit consists of three current sources, which are proportional to the modulation current Imod, bias current Ibias, and supply voltage Vcc. These currents are then summed into a load resistance $R_L$, which is connected to the power supply voltage Vcc. Any change in these currents will modulate the voltage drop across the load resistor $R_L$. The voltage drop across the load resistor adjusts the voltage vcascode, which in turn sets the voltage across the cascode device Q4 and the switching device Q2.

A typical response of the casode bias circuit is shown in FIG. 12b. For increasing modulation (Imod) or bias (Ibias) current, the voltage drop across the load resistor $R_L$ will increase, causing the voltage vcascode to decrease. This in turn causes the voltage across the cascode and switching devices to decrease. By appropriately setting the gain for the modulation and bias current sources, an optimal distribution of collector-emitter voltage across the casode device Q4, and switching device Q2 can be obtained. Also, a current proportional to the supply voltage Vcc is generated and summed into the load resistor $R_L$. If this current were not generated, any increase in the supply voltage would only increase the voltage across the switching device Q2. This could lead to excessive collector-emitter voltage across the device Q2 under conditions of high supply voltage, potentially causing a breakdown hazard. Also, by distributing any increase in the supply voltage across the cascode device and switching device, optimal switching performance can be obtained at the output.

Now referring to FIG. 13, a circuit similar to FIG. 12 may be seen. In FIG. 13, however, the bias current Ibias for cascode device Q4 is externally adjustable by a bias control signal applied to the terminal connected to the resistor Rbias1. In particular, the bias voltage is divided down by resistors Rbias1 and Rbias2 to provide a positive input to the operational amplifier Oabias. The amplifier controls the base of device Q15 to provide a current Ibias through the resistor Rbias to cause a voltage drop across the resistor Rbias equal to the divided down bias control voltage applied to the positive input of the amplifier OAbias. Thus the minimum current through the EAM/LD may be set externally to best match the characteristics of the EAM/LD.

Also in the circuit of FIG. 13, the Vmod control input is used to not only control the tail current for output switches Q1 and Q2, but also the tail current for devices Q10 and Q11 as well as the bias currents for devices Q5 and Q6. In particular, the Vmod control input, as divided down by resistors Rmod1 and Rmod2, is applied to the positive input of operational amplifier OAdriver, controlling the bases of devices Q12, Q13 and Q14 to cause a voltage drop across resistor Rdif and resistors Ref equal to the divided down Vmod control voltage. This, then, controls the modulation dependent component of the tail current in devices Q10 and Q11 and in the bias currents for devices Q5 and Q6. Finally, in this embodiment, the difference in the turn-on and turn-off currents for devices Q5 and Q6 is set by the higher voltage of the differential input Vin*, the voltage across the resistor Rpulldw being one VBE below the positive or the negative side of the differential input, whichever is higher at the time.

Now referring to FIG. 14, another alternate embodiment of the present invention may be seen. This embodiment is similar to the embodiment of FIG. 13 in many respects, though it generates the equivalent of Vin* of FIG. 13 as part of the integrated circuit, and also controls the increase in the turn-off current for devices Q5 and Q6 through the Vmod control input. In particular, the Vmod control input as divided down is also coupled to the positive input of the operational amplifier OApulldw. The negative input to the operational amplifier OApulldw is coupled to the pull-down resistor Rpulldw so that the output of the operational amplifier OApulldw will control device Q22 to control the voltage at the common connection of the load resistors Rc1. This sets the voltage across the resistor Rpulldw equal to the voltage on the Vmod control as divided down by the resistors Rmod1 and Rmod2. In particular, the voltage on the common connection of the load resistors Rc1 for devices Q20 and Q21 will be controlled by the feedback through the operational amplifier OApulldw to equal the voltage across the resistor Rpulldw, plus the VBE of device Q7 or Q8, plus the VBE of device Q16 or Q17, plus the VBE of device Q19 or Q18, depending on which set of devices is on at the time. Thus through this closed loop, the Vmod control signal controls not only the tail current for transistors Q10 and Q11 and the turn-on current for transistors Q5 and Q6, but also the extra current component Ipulldw_var for the turn-off current for devices Q5 and Q6.

In the embodiment of FIG. 12, the inductance Lmod and associated parasitic capacitance Cpar are shown, but are not shown in FIGS. 13 and 14. They are equally applicable to FIGS. 13 and 14, however, and are not shown for clarity reasons, to leave drawing space for the additional other circuitry illustrated in these Figures.

In the present invention, the capacitive loading effect of the output switches (devices Q1 and Q2) on the predriver output (emitter followers Q5 and Q6) is significantly reduced by using the cascode devices Q3 and Q4. These devices provide a low impedance at the collectors of the output switch and thus minimize the Miller multiplication effect of the base-collector capacitance of devices Q1 and Q2. As a result, the driving voltage at the bases of the output switch will have an increased edge speed, leading to faster or sharper edges of the output current/voltage.

Emitter followers running at high collector current and driving large capacitive loads lead to excessive voltage peaking that will be transferred into peaking of the output waveform, increasing the deterministic jitter. Using a cascoded output switch minimizes the capacitive loading of the last emitter follower of the pre-driver (Q5, Q6) and thus also minimizes the output peaking.

The cascode device from the active side (Q4) has the bias current summed to its emitter. As the summing is done at a low impedance node, the capacitive loading due to the bias circuit (Cbias) has negligible effect on the output edge speed. Furthermore, the voltage on the bias circuit is kept fairly constant, minimizing the modulation of the bias current by the output voltage.

This method of bias current summation is particularly suited for EAM drivers that do not need an additional series damping resistor (Rdamp—see FIG. 12) and that have very wide output voltage swings (as high as 3V). It assures an easy way of on-chip summation of the bias and modulation currents, without any significant penalty on the edge speed, while eliminating the expensive and large ferrite bead used in the prior art off-chip summation.

The cascode device on the dummy side (Q1) also has a permanent current through it, provided by the current source Idummy. This keeps the cascode device in the on-state all the time, significantly reducing its switching time by switching between the two on-state current levels, Idummy, when the output device Q1 is off, and Imod+Idummy when the output device Q1 is on.

The speed of the switching is critically dependent on the headroom (collector-emitter voltage) of both the switches Q1 and Q2 and the cascode devices Q3 and Q4. The separate Cascode Bias Circuit is implemented to assure the optimal headroom to the cascoded output switch devices as the supply voltage (VCC), modulation (Imod) and bias (Ibias) current changes. This circuit was shown in FIG. 12b. The collector emitter voltages of the Q1, Q2 switches and the Q3, Q4 cascode devices are given by:

$V_{CE}(Q1,Q2)=f_1(VCC,Imod,Ibias)$ $V_{CE}(Q3,Q4)=f_2(VCC,Imod,Ibias)$

In order to be able to use the cascoded output switch architecture while operating at a low supply voltage, the modulation current is generated by a simple resistor Rmod (most prior art use transistor based current sources that need more headroom and thus a higher supply voltage). The tail resistor Rmod is required to have as high a value as possible to assure a low variation of the modulation current with the variation of the voltage at the common emitter point of Q1 and Q2 during the switching process. The maximum value of the Rmod resistor is limited by the given supply voltage and the required headroom on the switch and cascode devices. Usually Rmod is only few Ohms, which leads to significant modulation current change during the switching process. To reduce this parasitic variation of the modulation current, an additional inductance (Lmod, FIG. 12) is connected in series with the tail resistor. This increases the AC impedance of the tail branch, while keeping the same DC impedance (assuming that the inductance has negligible series resistance). The tail inductance needs to withstand large currents (up to 120 mA). If on-chip inductances are used, they need to use very wide metal traces that lead to significant parasitic capacitances (Cpar) that short-out the inductance at high frequencies and thus cancel the beneficial effect of AC impedance increasing.

The present design uses a long bond wire as the tail inductance. The parasitic series resistance is low and does not affect the headroom, while the AC impedance at the data-rate frequency is several times higher than the tail resistance (Rmod), even with a 1–2 nH inductance.

Thus, the modulation current is set by a separate common mode DC feedback that imposes a voltage at the base of the transistor Q9, and through the base-emitter voltages of Q9, Q5/Q6 and Q1/Q2, regulates the voltage on the tail resistor (Vmod) that gives the value of the modulation current (Imod=Vmod/Rmod). The Imod current value is set by the voltage Vmod given by the resistor divider Rmod1 and Rmod2 that provides the reference voltage for the non-inverting input of the OAmod operational amplifier. The inverting input of OAmod is connected to the Rmod tail resistor and determines that Vmod=(Vmodcontrol)*Rmod2/(Rmod1+Rmod2).

In laser diode/EAM drivers, the modulation current is required to vary over very wide ranges (e.g. from 10 mA up to 120 mA). Keeping the rise/fall time under a maximum specified value while achieving an overshoot/undershoot no higher than a given value requires that both the voltage swing and the current level in the predriver be dependent on the modulation current. The optimal switching at the output (low rise/fall time and small overshoot) is achieved if the differential driving voltage swing is:

$$V\text{swing}=6V_T+I\text{mod}*R\text{degen}$$

Where: Rdegen is the total emitter degeneration resistance (either the intrinsic device emitter resistance if no external degeneration is provided, or the sum of the intrinsic emitter resistance and the external emitter degeneration if present), and $$VT=kT/q (\text{the thermal voltage})$$

The thermal voltage (VT=kT/q) is dependent on the absolute temperature of the driver die. At higher temperatures, a higher voltage swing is required. The optimal performance of the output switch is obtained if the driving swing has embedded therein the 6 VT temperature dependence. Also the driving swing needs to have a modulation current dependence in order to balance the voltage drop across the total emitter degeneration resistance (Imod*Rdegen). The driving swing is generated by the collector resistor (Rc) and the tail current at the predriver differential pair (Q10, Q11). The voltage swing required by the foregoing equation is provided by using two tail currents for the predriver differential pair: a PTAT current generated through the use of a PTAT Bandgap Reference that gives the 6VT voltage drop across the collector resistance (Rc), and a modulation current dependent current source Imod*=n*Imod that gives the Imod*Rdegen voltage drop across the collector resistance. In the circuit of FIG. 12, the modulation current dependent current source is set through the Imod control, whereas in the circuit of FIGS. 13 and 14, it is set together with the modulation current through the Vmod control, as previously explained.

The output switch devices Q1 and Q2 are operated very close to their transition frequency ($f_T/5 \ldots f_T/3$), which implies a low base current gain ($\beta=3 \ldots 5$). In order to supply the high AC base current required by the output switch, the emitter follower of the predriver needs to also run at high current levels.

Most prior art uses a standard emitter follower with a tail current variable with the modulation current (Imod). This assures a low variation of the turn-off time for the entire range of modulation currents. The output switch transistors need significantly lower pull-up current at turn-on than the pull-down current at turn-off (Ipull_up=Ipull_down/3 . . . 5). If the emitter follower current is the same at turn-on and turn-off and given by the turn-off time condition, excessive overshoot appears at the turn-on, degrading the deterministic jitter.

Some of the prior art laser diode/EAM drivers use a dynamic emitter follower that has a different current value when pulling-up (during turn-on) versus when pulling-down (during turn-off). One way to implement a dynamic emitter follower is to use one constant current source (Ifix) for each emitter follower and a differential pair driven in opposition of phase with respect to the emitter follower that will provide all its tail current (Idif) to the emitter follower that is pulling down (this is true if the delay of the helper differential pair is lower than the main signal path delay). The resulting pull-up and pull-down currents are given by:

$$I\text{pull\_up}=I\text{fix}$$

$$I\text{pull\_down}=I\text{fix}+I\text{dif}$$

The current at the differential pair (Idif) can be made dependent on the modulation current (Imod) and thus a variable driving capability of the emitter follower that pulls-down is assured as the modulation current changes, leading to a low variation of the rise/fall time over a wide current range. The drawback of this architecture is that the turn-on current is constant for all the modulation current range, leading to excessive overshoot at turn-on for low modulation current values.

The present invention adds a modulation current dependent pull-up current to the dynamic emitter follower, assuring very low variation of the overshoot for the entire range of modulation currents. The modulation current independent portion of the pull-up and pull-down currents are provided by a PTAT current source, assuring an optimal compromise between rise/fall time and overshoot/undershoot for a wide temperature range. The circuits of FIGS. 12, 13 and 14 provide an Imod dependent current for both turn-on and turn-off currents, optimizing the switching over a wide modulation current range. The PTAT and Imod dependencies of both voltage swing and current levels in the predriver lead to a much smaller variation (with respect to the prior art) of the rise/fall time and overshoot/undershoot of the output waveform (current or voltage) over a wide temperature and modulation current range. Thus less overshoot compensation and lower margins can be used when designing the optical transmitter system.

While the present invention has been illustrated using silicon-bipolar devices, the invention applies equally to heterojunction laser/EAM drivers and to MOS or HEMPT drivers.

In summary, the present invention proposes a cascaded output switch architecture that minimizes the Miller effect by providing a low impedance at the collectors of the output switch. Also the invention minimizes the output capacitance of the driver, increasing the frequency of the ringing and thus assuring an easier filtering. To keep the required headroom on the output switch while operating at the same supply voltages as the standard non-cascoded output switch, the tail current of the output switch (modulation current) is generated by a simple tail resistor. A common-mode feedback loop is added to regulate the voltage at the common emitter point and thus to impose the value of modulation current (Imod). The headroom of both the switch and the cascode device are optimized by a specially designed cascode bias generator that includes supply voltage, modulation current (Imod) and bias current (Ibias) dependencies.

In the case of EAM drivers, the cascoded switch architecture allows on-chip summation of the bias current directly at the emitter of the active cascode device, thus reducing the parasitic modulation of the bias current by the high amplitude output voltage, and also reducing the output capacitance of the driver.

The cascoded switch architecture minimizes both the output capacitance and capacitive loading on the predriver leading to a low deterministic jitter and a low overshoot of the output waveform while achieving a high edge speed.

The present invention uses a new temperature compensation technique that consists of including a positive temperature coefficient in both the driving voltage swing and the pull-up/pull-down currents of the pre-driver in order to assure a very low variation of the edge speed and to minimize the peaking variation over temperature. In present invention, PTAT current sources are used to automatically adjust the voltage swing and the predriver current level with the actual driver temperature. Also Imod dependence of voltage swing and predriver current levels at both turn-on and turn-off perform an automatic adjustment that keep constant the rise/fall time and the overshoot/undershoot over a wide range of modulation current.

The present invention also uses an alternative way of achieving the on-chip summation of the bias and modulation current, by doing it at a low impedance node and thus minimizing the edge speed penalty.

While certain preferred embodiments of the present invention have been disclosed and described herein, it will be understood by those skilled in the art that various changes in form and detail may be made therein without departing from the spirit and scope of the invention. Similarly, the various aspects of the present invention may be advantageously practiced by incorporating all features or various sub-combinations of features in any specific LD/EAM design.

What is claimed is:

1. A laser diode/electro-absorption-modulator (LD/EAM) driver comprising:
   a cascoded output switch having a pair of output devices and a pair of cascode devices;
   a resistor providing tail current to the output devices;
   a predriver circuit receiving an input signal and controlling the output devices;
   a feedback circuit coupled to the resistor to control a modulation current of the output devices by control of bias on the predriver circuit;
   a common mode feedback circuit providing modulation dependent currents for the predriver circuit; and,
   a cascode bias circuit coupled to bias the cascode devices to a bias voltage responsive to a power supply voltage, the output bias current and the modulation current.

2. The LD/EAM driver of claim 1 further comprised of an output bias circuit providing for on-chip summation of the modulation and an output bias current at a low impedance node of the active cascode device.

3. The LD/EAM driver of claim 1 further comprised of a PTAT bandgap reference circuit to generate biasing currents with positive temperature coefficients for the predriver circuit.

4. The LD/EAM driver of claim 3 wherein the modulation current is externally adjustable.

5. The LD/EAM driver of claim 1 wherein the modulation current is externally adjustable.

6. The LD/EAM driver of claim 1 wherein the LD/EAM driver is an integrated circuit and the predriver bias current control and the modulation current are externally adjustable.

7. The LD/EAM driver of claim 1 wherein the LD/EAM driver is an integrated circuit and the predriver bias current control and the modulation current are externally adjustable by a single external adjustment.

8. The LD/EAM driver of claim 1 wherein the LD/EAM driver is an integrated circuit and the predriver bias current control and the modulation current are independently externally adjustable.

9. The LD/EAM driver of claim 1 further comprised of a pulldown variance circuit coupled to the predriver, the pulldown variance circuit causing a turnoff current of the predriver to be larger than a turn-on current of the predriver.

10. The LD/EAM driver of claim 9 further comprised of a PTAT bandgap reference circuit to generate biasing currents with positive temperature coefficients for the predriver circuit.

11. The LD/EAM driver of claim 10 wherein the pulldown variance circuit is responsive to the output of the bandgap reference.

12. A laser diode/electro-absorption-modulator (LD/EAM) driver comprising:
   a cascoded output switch having a pair of output devices and a pair of cascode devices;
   a resistor providing tail current to the output devices;
   a predriver circuit receiving an input signal and controlling the output devices;
   a feedback circuit coupled to the resistor to control a modulation current of the output devices by control of bias on the predriver circuit;
   a common mode feedback circuit providing modulation dependent currents for the predriver; and,
   a pulldown variance circuit coupled to the predriver, the pulldown variance circuit causing a turnoff current of the predriver to be larger than a turn-on current of the predriver.

13. The LD/EAM driver of claim 12 further comprised of a PTAT bandgap reference circuit to generate biasing currents with positive temperature coefficients for the predriver circuit.

14. The LD/EAM driver of claim 13 wherein the pulldown variance circuit is responsive to the output of the bandgap reference.

15. A laser diode/electro-absorption-modulator (LD/EAM) driver comprising:
   a cascoded output switch having a pair of output devices and a pair of cascode devices;
   a resistor providing tail current to the output devices;
   a predriver circuit receiving an input signal and controlling the output devices;
   a feedback circuit coupled to the resistor to control a modulation current of the output devices by control of bias on the predriver circuit;
   a common mode feedback circuit providing modulation dependent currents for the predriver circuit;
   a cascode bias circuit coupled to bias the cascode devices to a bias voltage responsive to a power supply voltage, an output bias current and the modulation current; and,
   a pulldown variance circuit coupled to the predriver, the pulldown variance circuit causing a turnoff current of the predriver to be larger than a turn-on current of the predriver.

16. The LD/EAM driver of claim 15 further comprised of a PTAT bandgap reference circuit to generate biasing currents with positive temperature coefficients for the predriver circuit.

17. The LD/EAM driver of claim 16 wherein the pulldown variance circuit is responsive to the output of the bandgap reference.

18. The LD/EAM driver of claim 17 wherein the pulldown variance circuit is responsive to the output of the bandgap reference.

19. A laser diode/electro-absorption-modulator (LD/EAM) driver comprising:
- a cascoded output switch having a pair of output devices and a pair of cascode devices;
- a resistor providing tail current to the output devices;
- a predriver circuit receiving an input signal and controlling the output devices;
- a feedback circuit coupled to the resistor to control a modulation current of the output devices by control of bias on the predriver circuit;
- a common mode feedback circuit providing modulation dependent currents for the predriver circuit;
- a cascode bias circuit coupled to bias the cascode devices to a bias voltage responsive to a power supply voltage, an output bias current and the modulation current;
- a PTAT bandgap reference circuit to generate biasing currents with positive temperature coefficients for the predriver circuit; and,
- a pulldown variance circuit coupled to the predriver, the pulldown variance circuit causing a turnoff current of the predriver to be larger than a turn-on current of the predriver.

20. The LID/EAM driver of claim 19 wherein the modulation current is externally adjustable.

21. The LD/EAM driver of claim 19 wherein the LD/EAM driver is an integrated circuit and the predriver bias current control and the modulation current are externally adjustable.

22. The LD/EAM driver of claim 19 wherein the LD/EAM driver is an integrated circuit and the predriver bias current control and the modulation current are externally adjustable by a single external adjustment.

23. The LD/EAM driver of claim 19 wherein the LD/EAM driver is an integrated circuit and the predriver bias current control and the modulation current are independently externally adjustable.

24. The LD/EAM driver of claim 23 wherein the pulldown variance circuit is responsive to the output of the bandgap reference.

* * * * *